United States Patent [19]
Lee

[11] Patent Number: 5,978,278
[45] Date of Patent: Nov. 2, 1999

[54] FLASH MEMORY HAVING LOW THRESHOLD VOLTAGE DISTRIBUTION

[75] Inventor: Peter Wung Lee, Saratoga, Calif.

[73] Assignee: Aplus Integrated Circuits, Inc., Santa Clara, Calif.

[21] Appl. No.: 08/977,194

[22] Filed: Nov. 24, 1997

[51] Int. Cl.⁶ ................................................. G11C 16/04
[52] U.S. Cl. ............................... 365/185.33; 365/185.24; 365/185.29
[58] Field of Search .................... 365/185.33, 185.24, 365/185.29, 185.3, 185.32

[56] References Cited

U.S. PATENT DOCUMENTS

| | | | |
|---|---|---|---|
| 5,526,315 | 6/1996 | Kaya et al. | 365/185.18 |
| 5,724,289 | 3/1998 | Watanabe | 365/201 |
| 5,729,494 | 3/1998 | Gotou et al. | 365/185.24 |

*Primary Examiner*—David Nelms
*Assistant Examiner*—Hien Nguyen

[57] ABSTRACT

A flash memory device having a low threshold voltage distribution is disclosed. The threshold voltage in a program state of a flash memory cell is defined to be near or slightly greater than approximately 3.0 volts. The threshold voltage in an erased state is defined to be less than 0.7 volts or at ground level. The low threshold voltage distribution makes it possible to use a low voltage around 3.0 volts for the gate of the memory cell in a read operation. The UV erased threshold is raised to near the threshold voltage of a program state to avoid data retention problem.

8 Claims, 2 Drawing Sheets

FLASH MEMORY HAVING LOW THRESHOLD VOLTAGE DISTRIBUTION

FIELD OF THE INVENTION

This invention relates to the operation of a NOR-plane flash memory array, more particularly to the definition of threshold voltages in high and low states of a flash memory array as well as its UV erased threshold voltage.

BACKGROUND OF THE INVENTION

In recent years, flash memory devices have been widely used in computer related equipment and other electronic appliances as storage devices. The nonvolatile and in-system programmable capabilities of a flash memory are very important for storing data in many applications. As an example, flash memories are frequently used for the BIOS storage of a personal computer. In addition, the small physical size of flash memories also makes them very suitable for portable applications. Therefore, they have been used for storing programs and data for many portable electronic devices such as cellular phones, digital cameras and video game platforms. It becomes more and more important that the flash memory devices can be used in portable systems that have only low voltage power supply.

An EPROM type flash memory uses Fowler-Nordheim (F-N) tunneling effect to erase memory cells' threshold voltages (Vts) to a low state, and uses channel-hot-electron (CHE) injection to program cell' Vts to a high state. Traditionally, the cell array is a NOR-plane array. Therefore, a higher threshold voltage Vt(0) is programmed for data "0" and a low threshold voltage Vt(1) is for data "1". The threshold voltage Vt(1) in the low state is in the range of about 0.5 volts to 3 volts. Vt(1) below 0.5 volts is not permitted to avoid the sub-threshold leakage induced by the coupling of the bit line voltage to the memory cell's floating gate during read and program operations. When many memory cells are connected to the same bit line, the overall threshold leakage of the selected bit line can be greater than 100 uAs that may result in false reading or greater than several mAs that may overload the on-chip pump in the program operation. In the high state, the threshold voltage Vt(0) is usually greater than 6.5 volts.

Because of the wide threshold voltage distribution between low and high states, the gate (word line) voltage has to be about 5 volts in a memory read operation in order to distinguish the two states regardless of the power supply condition. If the power supply voltage Vdd is greater than 5 volts, the gate voltage can be easily applied. However, many portable systems now have only low voltage power supply with Vdd ranging from 2.0 volts to 5.0 volts to reduce power consumption. Under the low Vdd condition such as 2 or 3 volts, it is necessary to boost the voltage to around 5 volts so that the word line of the flash memory can be biased properly in a read operation. The voltage boosting circuit is fairly complicated and requires much device area. It becomes a significant drawback for a portable system to use such flash memories.

Data retention is another major problem that conventional flash memories have to be concerned with. Traditionally, a flash memory cell is manufactured with a threshold voltage around 2 volts after UV (ultra-violet) erasure. UV erased threshold voltage Vt(UV) represents the threshold voltage when there is no electrons in the floating gate of the memory cell. It is known that the electrons being stored in the floating gate by programming a flash memory cell to a high state may eventually move away and reduce the threshold voltage to Vt(UV) after a long period of time. This would cause the data retention problem. Data retention is a concern as long as the high state voltage Vt(0) is much greater than Vt(UV). As it is well known, the higher the voltages of Vt(0) and Vt(1), the sooner the memory decaying speed. Typically, 1 volt of Vt drop from 6 volts to 5 volts is ten times faster than 1 volt drop from 5 volts to 4 volts. Therefore, data retention is less a concern for Vt(1) than Vt(0). It is desirable that both Vt(0) and Vt(1) be kept as low as possible as Vdd is scaled down to reduce the Vt decaying speed and thus solves the data retention problem.

In the traditional NOR-plane flash memory array, however, lowering Vt(0) and Vt(1) would result in higher possibility of over-erasure that ends up with negative Vt(0) and Vt(1). Therefore, Vt(0) and Vt(1) can not be much reduced as Vdd is lowered. In other words, in the conventional flash memory, Vt(0) is still defined to be much higher than Vt(UV) and Vt(1) is near or below Vt(UV) but can not be the ground level when Vdd is between 2 volts and 5 volts.

SUMMARY OF THE INVENTION

The present invention has been made to overcome the above-mentioned drawbacks of a conventional flash memory device. The primary object of the invention is to provide a flash memory having a lower and narrow threshold voltage distribution for both Vt(1) and Vt(0) so that it can be operated under low power supply voltage without a voltage boosting circuit for the word line. The second object is to provide a flash memory cell having Vt(1) defined much lower than UV erased threshold voltage Vt(UV), and Vt(0) defined near or slightly higher than Vt(UV). Another object is to provide an adjustable and higher Vt(UV), for the flash memory to avoid or greatly reduce the data retention problem.

According to the present invention, both the high threshold voltage Vt(0) for data "0" and the low threshold voltage Vt(1) for data "1" are lowered to decrease the threshold voltage distribution. By having lower Vt(0) and Vt(1), a lower gate voltage can be used in reading the flash memory cells. Therefore, it is not necessary to boost the power supply voltage for the word line. In addition, during a program operation the program voltage can be lower and program time can also be reduced for better device scalability.

In order to avoid the data retention problem, this invention provides a higher UV erased threshold voltage Vt(UV). The Vt(UV) is set to be within the range of the high state threshold voltage Vt(0). Under this condition, the flash memory cell has no electrons in the floating gate when it is in the data "0" high state. Therefore, the data retention problem caused by the fleeing of electrons can be avoided.

DETAILED DESCRIPTION OF THE PREFERRED EMBODIMENTS

Figure 1:
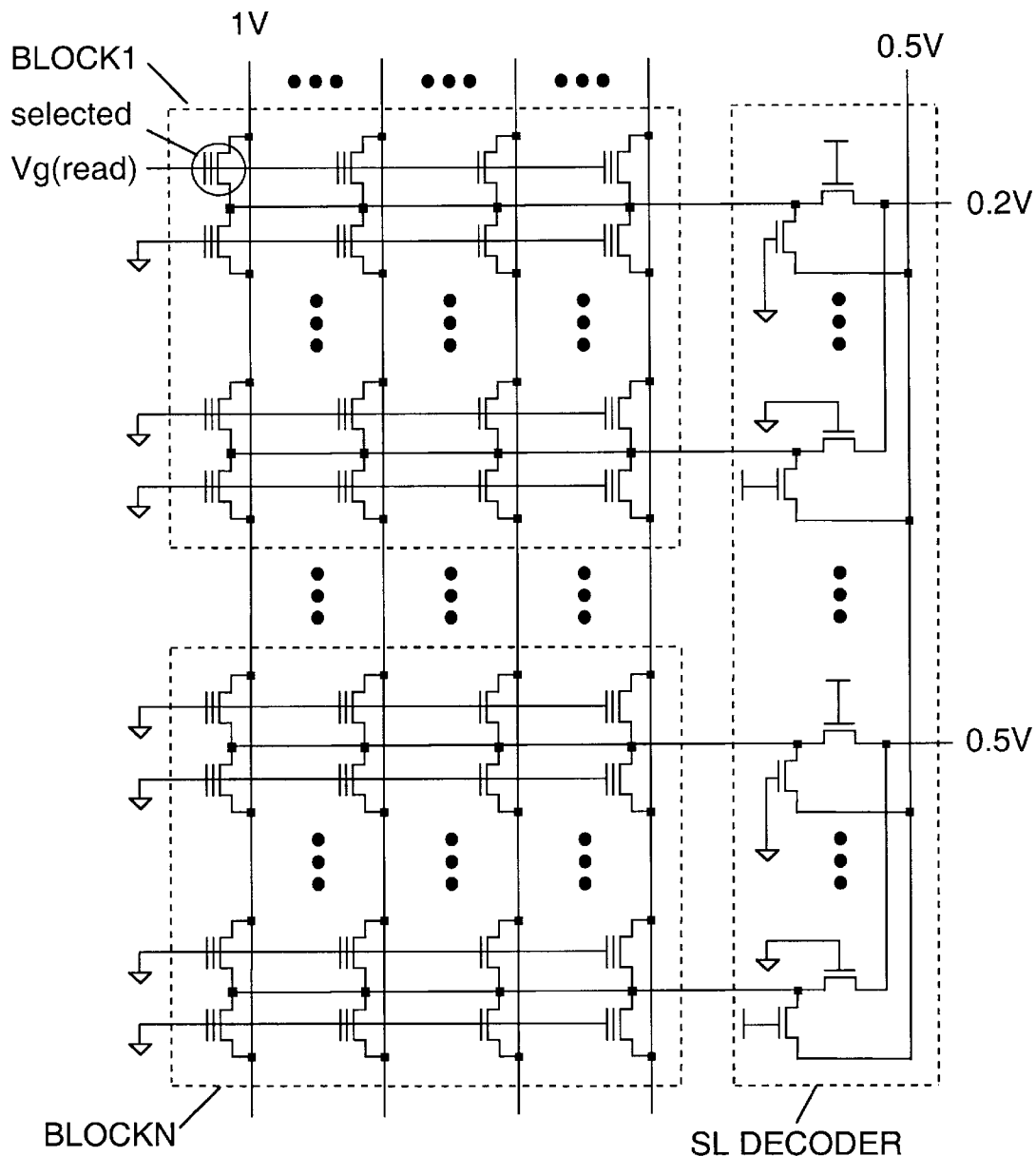
FIG. 1 shows the bias condition for a read operation of this invention.

The threshold voltage of a conventional EPROM type memory has a relatively wide distribution. Typically, the threshold voltage of a program state is greater than 6.5 volts and that of an erased state is between 0.5 volts and 3.0 volts. The wide distribution is to ensure that a read voltage around 5.0 volts at a selected gate (word line) and 0 volt at all unselected gates (word lines) and sources can properly distinguish the two states, Vt(1) and Vt(0) of the memory cell. Vt(1) is kept higher than 0.5 volts instead of ground level to avoid the sub-threshold leakage caused by the unselected cells in the selected bit lines with grounded word lines. The sub-threshold leakage in the selected bit line is due to the fact that the bit line voltage of about 1.0 volt is coupled to turn on all the unselected floating gates although the unselected gates and sources of the memory cells are grounded in a read operation. Although it is desirable that threshold voltages have smaller distribution so that a lower word line voltage can be used for a read operation under a low power supply voltage condition, the over-erasure problem has made it difficult to decrease the range of the threshold voltage at the erased state. It has been a common practice to maintain a range between 0.5 volts and 3.0 volts for the threshold voltage of the erased state of Vt(1).

U.S. patent application Ser. No. 08/823,571 titled "Novel Approaches to Fully Eliminating Over-erasure Induced Problems and Enhancing Write Operation" assigned to the same assignee of this application has presented a circuit approach for overcoming the over-erasure problem. By using the approach disclosed in the referenced application, it becomes possible to erase a flash memory device so that the threshold voltages of the memory cells are lower than approximately 0.7 volts or even at ground level without having to worry about the over-erasure and sub-threshold problems. Therefore, the traditional Vt(1) which is defined near or lower than Vt(UV) of 2 volts and Vt(0) which is defined much higher can be redefined. This invention defines Vt(1) to be much lower than Vt(UV) or as low as ground level and Vt(0) to be near or slightly higher than Vt(UV).

Based on the ability to achieve a smaller range of threshold voltages for the erased state of an EPROM flash memory without over-erasure problems, this invention presents a novel operational condition for a flash memory device. The operational condition is designed to be suitable for portable systems that usually have a low power supply voltage Vdd such as 3.0 volts. According to this invention, the threshold voltage Vt(0) of a program state or data "0" is defined as slightly greater than Vdd. The threshold voltage Vt(1) of an erased state or data "1" is defined to be less than 0.7 volts. For a read operation, the voltage Vg at the gate is set to be slightly smaller than the threshold voltage of the program state. The margin between Vt(0) and Vg is to ensure that the flash memory cell will be turned off so that a data "0" can be read. Because Vt(1) is smaller than 0.7 volts, the memory cell will be turned on by the higher word line voltage and a data "1" can be read.

FIG. 1 shows the bias condition of a read operation for the flash memory in this invention. For the selected memory cell, its selected vertical bit line is applied 1 volts and its source line is passed with 0.2 volts through the SL decoder as shown in FIG. 1. Other unselected source lines are passed with 0.5 volts instead of a ground level commonly used in a conventional flash memory array. The gate voltage Vg(read) is 3 volts. Because of the low read voltage, the power consumption is significantly lowered. As mentioned earlier, Vt(1) is less than 0.7 volts. The voltage difference Vgs−Vt(1) is roughly 3.0−0.2−0.7=2.1 volts, where Vgs is gate to source voltage. In a conventional bias condition in which the gate voltage is 5 volts, the voltage difference is approximately 4.5−0.0−3.0=1.5 volts. The read current is comparable. The unselected source lines are applied 0.5 volts to fully suppress the sub-threshold leakage of the unselected memory cells in the selected bit line. The total source current is negligible (approximately 1.0 uA) even under the worst case when all the unselected memory cells have low threshold voltage Vt=−0.2 volts.

Figure 2:
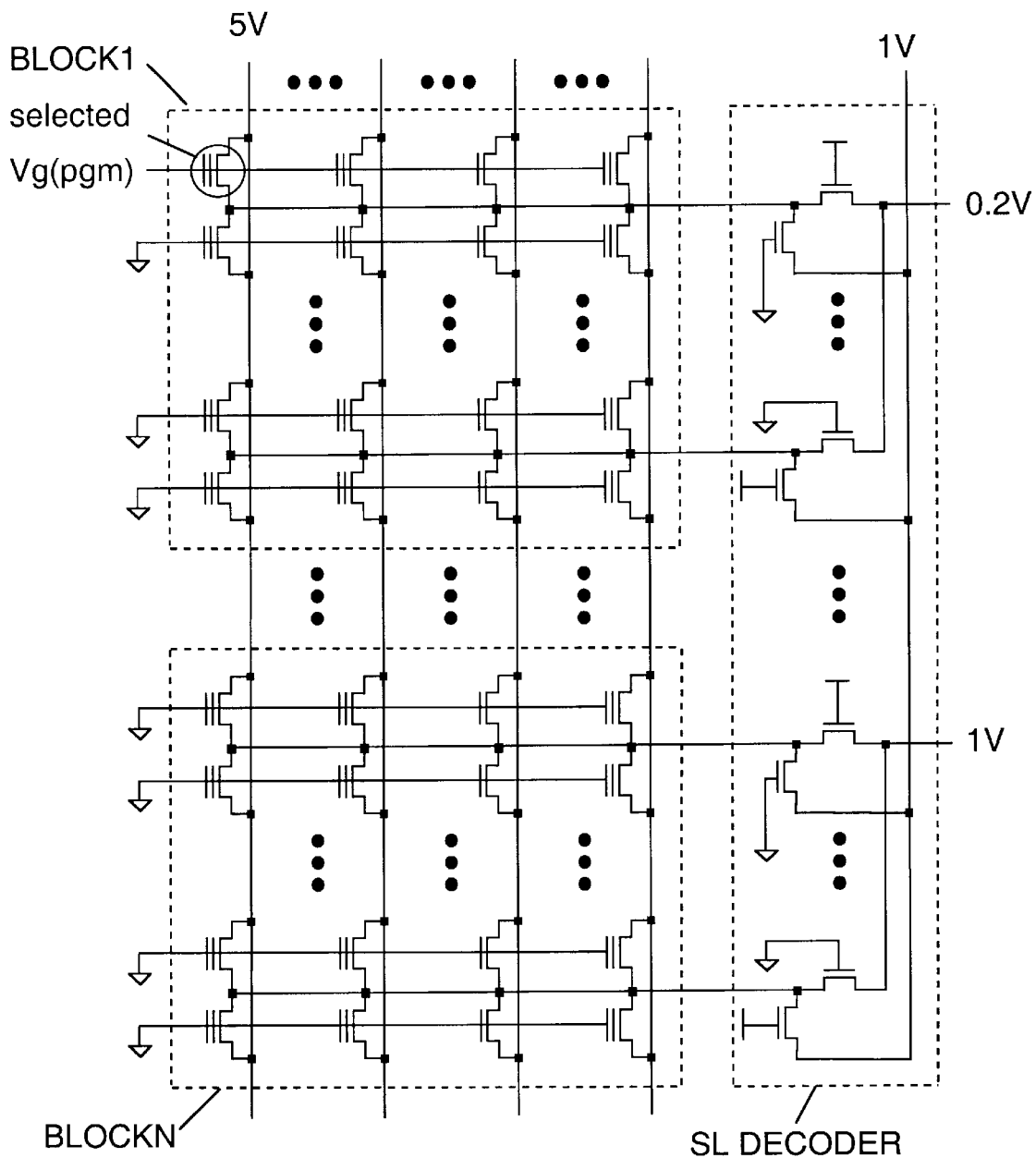
FIG. 2 show the bias condition for a program operation of this invention.

FIG. 2 shows the bias condition of a program operation for the flash memory in this invention. As shown in FIG. 2, for the selected memory cell, its selected bit line is applied 5.0 volts and its source line is passed with 0.2 volts through the SL decoder. Other unselected source lines are passed with 1 volt. The selected word line is applied with an adjustable gate voltage that is a function of the maximum threshold voltage of erased memory cells. Because of the adjustable voltage, highest program efficiency can be achieved. As can be seen from FIG. 2, on the unselected word line, the unselected source line is applied 1.0 volt to fully eliminate sub-threshold leakage of the unselected memory cells in the selected bit line. Therefore, the conventional hot-hole injection problem caused by drain disturbance on the unselected memory cells are eliminated.

From the above description for FIGS. 1 and 2, it can be seen that this invention requires two different source line voltages in either a read operation or a program operation to fully eliminate the sub-threshold leakage. The higher source voltage is used to suppress the sub-threshold leakage in the unselected memory cells in the selected bit lines. The lower source line voltage is used to shut off the sub-threshold leakage in the unselected memory cells in the unselected bit lines.

As discussed above, the flash memory of the present invention has a smaller threshold voltage distribution. The gate (word line) voltage can be directly taken from the low power supply voltage which typically is 3.0±0.3 volts. This results in a significant advantage over the conventional flash memory because no boosting circuit is required for supplying the higher voltage (5 volts) to the gate. If a higher power supply voltage is available, it can be easily clamped down to satisfy the required lower gate voltage. In addition, a lower threshold voltage for the program state also shortens the program time for the memory device. The scalability of the device is also greatly improved.

A flash memory cell has a characteristic usually called UV erased threshold voltage Vt(UV) that represents the threshold voltage when there exists no free electrons in the floating gate of the memory cell. Vt(UV) can be controlled by the implant dose of Boron to the memory cell. The UV erased threshold voltage of a conventional flash memory cell is adjusted to approximately 2.0 volts. For a conventional flash memory cell to operate properly, Vt(1) is set in the range of 0.5 volts to 3.0 volts and Vt(0) is usually set higher than 6.5 volts as described earlier. Because Vt(0) of data "0" is much higher than Vt(UV), there exists some electrons in the floating gate of the memory cell during this high state. If the electrons flee away from the floating gate, data "0" would be lost. Hence, a flash memory has a limited life time due to the data retention problem. This invention further presents a higher Vt(UV) for the flash memory cell. By increasing the implant dose of Boron, Vt(UV) can be adjusted higher. The preferred Vt(UV) of the present invention is approximately 3.0 volts. Therefore, in contrast to traditional Vt(1) and Vt(0), this invention proposes a Vt(0) that is near or slightly higher than Vt(UV). The preferred voltage for Vt(UV) in this invention is adjusted according to the power supply voltage Vdd. In general, Vt(UV) is adjusted near the value of Vdd. Furthermore, Vt(1) is defined to be much lower than Vt(UV) for higher read current without having to use a boosted word line voltage in a read operation.

Although the threshold Vt(0) of a program state is still slightly higher than Vt(UV), Vt(0) will at most drop to Vt(UV). In a read operation, data "0" will not be lost due to the drop of the threshold voltage. Consequently, the data retention problem is avoided or much reduced. In addition, the word line voltage of this invention can be made adjustable according to the UV erased voltage Vt(UV) to further reduce the data retention problem.

What is claimed is:

1. A flash memory array comprising:

a plurality of flash memory cells being arranged as a plurality of rows each having a source line and a plurality of columns each having a bit line;

a selected bit line and a selected source line for selecting a flash memory cell in a read operation;

a first source line voltage for said selected source line, said first source line voltage being higher than the ground level of said flash memory array for shutting off the sub-threshold leakage of unselected memory cells in said selected source line; and a second source line voltage for an unselected source line, said second source line voltage suppressing the sub-threshold leakage of an unselected flash memory cell connected to said unselected source line and said selected bit line;

wherein said first source line voltage is approximately 0.2 volts and said second source line voltage is approximately 0.5 volts in a read operation.

2. A flash memory array comprising:

a plurality of flash memory cells being arranged as a plurality of rows each having a source line and a plurality of columns each having a bit line;

a selected bit line and a selected source line for selecting a flash memory cell in a program operation;

a first source line voltage for said selected source line, said first source line voltage being higher than the ground level of said flash memory array for shutting off the sub-threshold leakage of unselected memory cells in said selected source line; and a second source line voltage for an unselected source line, said second source line voltage suppressing the sub-threshold leakage of an unselected flash memory cell connected to said unselected source line and said selected bit line;

wherein said first source line voltage is approximately 0.2 volts and said second source line voltage is approximately 1.0 volts in a program operation.

3. A flash memory array comprising:

a plurality of flash memory cells being arranged as a plurality of rows each having a source line and a plurality of columns each having a bit line, each of said flash memory cells having a first threshold voltage in the range of 3.0 to 3.3 volts for a program state and a second threshold voltage for an erased state;

a selected bit line and a selected source line for selecting a flash memory cell in a read operation;

a word line voltage applied to a word line connected to said selected flash memory cell;

a first source line voltage for said selected source line, said first source line voltage being higher than the ground level of said flash memory array for shutting off the sub-threshold leakage of unselected memory cells in said selected source line; and a second source line voltage for an unselected source line, said second source line voltage suppressing the sub-threshold leakage of an unselected flash memory cell connected to said unselected source line and said selected bit line;

wherein the first threshold voltage of said selected memory cell being greater than said word line voltage for turning off said selected memory cell if said selected memory cell is in a program state, and the second threshold voltage of said selected memory cell being sufficiently smaller than said word line voltage for turning on said selected memory cell if said selected memory cell is in an erased state in a read operation.

4. The flash memory array according to claim 3, wherein each of said flash memory cells has a second threshold voltage smaller than 0.7 volts.

5. The flash memory array according to claim 3, wherein a majority of said flash memory cells have second threshold voltages at approximately the ground level of said flash memory array.

6. The flash memory array according to claim 3, said flash memory array further having a power supply voltage lower than said first threshold voltage.

7. The flash memory array according to claim 6, said word line voltage being approximately equal to said power supply voltage.

8. The flash memory array according to claim 7, said word line voltage being approximately 3 volts.

* * * * *